US012805261B2

(12) United States Patent

Okamura et al.

(10) Patent No.: US 12,805,261 B2

(45) Date of Patent: Nov. 17, 2026

(54) SUBSTRATE TRANSFER SYSTEM

(71) Applicant: Tokyo Electron Limited, Tokyo (JP)

(72) Inventors: Tatsuru Okamura, Miyagi (JP); Norihiko Amikura, Miyagi (JP); Masatomo Kita, Miyagi (JP); Takehiro Shindo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 271 days.

(21) Appl. No.: 18/605,892

(22) Filed: Mar. 15, 2024

(65) Prior Publication Data

US 2024/0222185 A1 Jul. 4, 2024

Related U.S. Application Data

(63) Continuation of application No. PCT/JP2022/044243, filed on Nov. 30, 2022.

(30) Foreign Application Priority Data

Jan. 19, 2022 (JP) ................................ 2022-006599

(51) Int. Cl.

*H10P 72/76* (2026.01)
*B25J 11/00* (2006.01)
*B25J 19/00* (2006.01)
*H10P 72/00* (2026.01)

(52) U.S. Cl.

CPC ....... *H10P 72/7602* (2026.01); *B25J 11/0095* (2013.01); *B25J 19/0054* (2013.01); *H10P 72/0602* (2026.01); *H10P 72/0604* (2026.01)

(58) Field of Classification Search

CPC ............. H10P 72/7602; H10P 72/0602; H10P 72/0604; H10P 72/0432; H10P 72/0434;

(Continued)

(56) References Cited

U.S. PATENT DOCUMENTS 8,430,620 B1 * 4/2013 Blank ................. H10P 72/3302 414/217
2011/0220148 A1 * 9/2011 Consiglio ........... C23C 16/4407 134/32

(Continued)

FOREIGN PATENT DOCUMENTS

JP H04-186860 A 7/1992
JP 2001-291664 A 10/2001

(Continued)

OTHER PUBLICATIONS

Yazawa Takayuki, "産業用ロボット" (espacenet machine translation for JPWO2015037701A1), Mar. 2, 2017, espacenet machine translations (Year: 2017).*

(Continued)

*Primary Examiner* — Christopher W Carter

(74) *Attorney, Agent, or Firm* — XSENSUS LLP

(57) ABSTRACT

A substrate transfer system includes a substrate processing assembly, a substrate transfer assembly, and a controller. The substrate processing assembly includes a substrate processing chamber, a substrate support, and a first temperature sensor that measures a temperature of the substrate support. The substrate transfer assembly includes a substrate transfer chamber, a robotic substrate transferrer, and a temperature control system. The robotic substrate transferrer includes a first end-effector that holds a high-temperature substrate, a second end-effector that holds a low-temperature substrate, and a deposit detector located adjacent to at least one of the end-effectors. The temperature control system includes a cooling gas supply that supplies a cooling gas into the robotic substrate transferrer, a second temperature sensor that measures a temperature of an internal space of the robotic substrate transferrer, and a temperature adjuster that (Continued)

adjusts a temperature of the cooling gas based on an output from the second temperature sensor.

18 Claims, 3 Drawing Sheets

(58) Field of Classification Search
CPC .. H10P 72/0464; H10P 72/30; H10P 72/3302; H10P 72/0454; H10P 72/0462; H10P 72/3311; B25J 11/0095; B25J 19/0054; B25J 19/00; B25J 15/009
See application file for complete search history.

(56) References Cited

U.S. PATENT DOCUMENTS

2017/0004984 A1* 1/2017 Nagaike .............. H10P 72/0464
2017/0076964 A1* 3/2017 Sawada ............... H10P 72/0434

FOREIGN PATENT DOCUMENTS

JP 2008-006535 A 1/2008
JP 2011-176197 A 9/2011
JP 2011-205044 A 10/2011
JP 2013-139071 A 7/2013
JP 2017-017154 A 1/2017
JP 2020-017645 A 1/2020
JP 2021-034517 A 3/2021
WO 2015/037701 A1 3/2015
WO 2019/167235 A1 9/2019
WO 2020/066571 A1 4/2020

OTHER PUBLICATIONS

International Search Report and Written Opinion mailed on Jan. 10, 2023, received for PCT Application PCT/JP2022/044243, filed on Nov. 30, 2022, 12 pages including English Translation.

* cited by examiner

SUBSTRATE TRANSFER SYSTEM

CROSS-REFERENCE TO RELATED APPLICATIONS

This application is a Continuation of PCT International Application No. PCT/JP2022/044243, filed on Nov. 30, 2022, which claims priority under 35 U.S.C. § 119(a) to JP2022-006599, filed in Japan on Jan. 19, 2022, all of which are hereby expressly incorporated by reference into the present application.

FIELD

The disclosure relates to a substrate transfer system.

BACKGROUND

Patent Literature 1 describes an articulated transferrer including a first holding arm that holds a first substrate, a second holding arm that holds a second substrate, and a drive arm having one end connected to the first holding arm and the second holding arm with a driver between the end and the arms.

CITATION LIST

Patent Literature

Patent Literature 1: Japanese Unexamined Patent Application Publication No. 2021-48242

SUMMARY

Technical Problem

One or more aspects of the disclosure are directed to a technique for improving the accuracy of transferring substrates using a robotic transferrer.

Solution to Problem

A substrate transfer system according to one aspect of the disclosure includes a substrate processing module, a substrate transfer module connected to the substrate processing module, and at least one controller. The substrate processing module includes a substrate processing chamber, a substrate support in the substrate processing chamber, and a first temperature sensor that measures a temperature of the substrate support. The substrate transfer module includes a substrate transfer chamber, a robotic substrate transferrer in the substrate transfer chamber, and a temperature control system. The robotic substrate transferrer includes a first end-effector including a first holding pad that holds a substrate processed at a high temperature in the substrate processing module, a second end-effector including a second holding pad that holds a substrate processed at a low temperature in the substrate processing module, and at least one deposit detector located adjacent to at least one of the first end-effector or the second end-effector. The temperature control system includes a cooling gas supply that supplies a cooling gas into the robotic substrate transferrer, a second temperature sensor that measures a temperature of an internal space of the robotic substrate transferrer, and a temperature adjuster that adjusts a temperature of the cooling gas based on an output from the second temperature sensor. The at least one controller determines, based on an output from the first temperature sensor, whether a substrate on the substrate support is to be transferred with the first end-effector or with the second end-effector, and determines timing to clean an internal space of the substrate transfer chamber based on an output from the at least one deposit detector.

Advantageous Effects

The technique according to the above aspect of the disclosure improves the accuracy of transferring substrates using the robotic transferrer.

DETAILED DESCRIPTION

Figure 1:
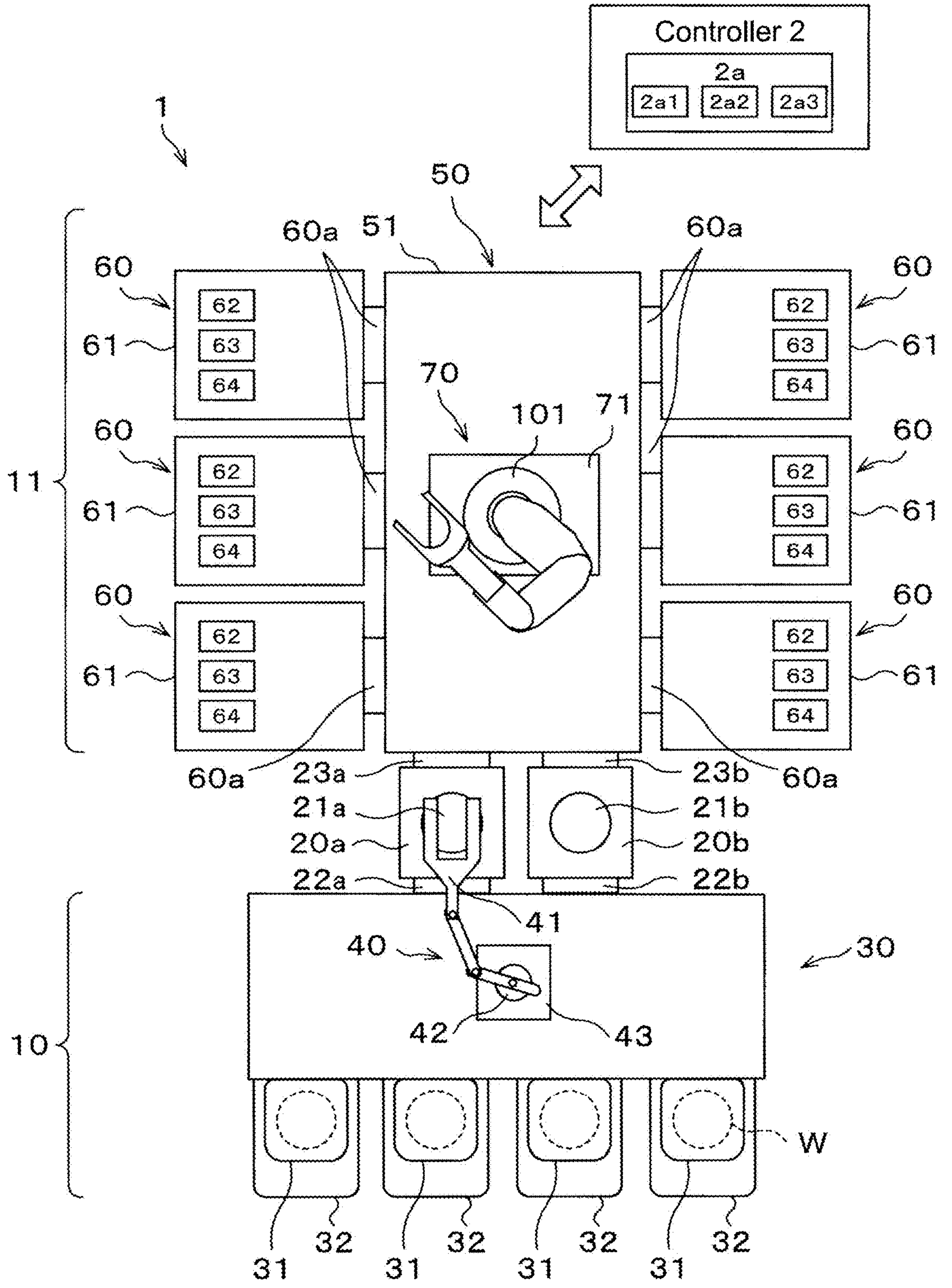
FIG. 1 is a schematic plan view of a substrate processing system according to an embodiment.

In the processes of manufacturing semiconductor devices, a semiconductor substrate (hereafter simply referred to as a substrate) supported by a substrate support in a processing chamber undergoes various types of substrate processing, such as etching, film deposition, and diffusion coating. The processing chamber for such processing is located adjacent to a transfer chamber in which the substrate is transferred.

The substrate is transferred between the processing chamber and the transfer chamber by an articulated robotic transferrer located in the transfer chamber (refer to Patent Literature 1). The articulated robotic transferrer may have various factors that can lower the accuracy of transferring the substrate.

For example, a holding pad to hold a substrate is located on the robotic transferrer. When deposits adhere to and accumulate on the holding pad, the substrate may slip horizontally on the robotic transferrer. A system involving both high-temperature processing and low-temperature processing, or a system transferring both high-temperature substrates and low-temperature substrates may not appropriately transfer any substrate as a transfer target with a temperature deviating from an appropriate temperature range for the holding pad. Additionally, the drives, such as motors incorporated in the shafts of the articulated robotic transferrer, described above may generate heat during operation that may increase the temperature of the robotic transferrer, which may lower the accuracy of transferring substrates.

Under such circumstances, the technique according to one or more embodiments of the disclosure is directed to improving the accuracy of transferring substrates using a robotic transferrer. A plasma processing system as a substrate transfer system according to the present embodiment will now be described with reference to the drawings. The same reference numerals denote components having substantially the same functions herein and in the drawings. Such components will not be described repeatedly.

Plasma Processing System

In one embodiment, the plasma processing system includes a plasma processing apparatus 1 and a controller 2 as shown in FIG. 1. The plasma processing system is an example of a substrate processing system and an example of the substrate transfer system. The plasma processing apparatus 1 is an example of a substrate processing apparatus. A wafer is an example of a substrate W. In the plasma processing system, the substrate W undergoes intended processing, such as film deposition or etching in a decompressed atmosphere (e.g., under a vacuum atmosphere). The structure of the plasma processing system according to one or more embodiments of the disclosure is not limited to the above structure, and may be selected as appropriate.

The plasma processing apparatus 1 includes an atmospheric unit 10 (e.g., atmospheric assembly) and a decompressor 11 that are integrally connected with loadlock modules 20*a* and 20*b* between them. In the atmospheric unit 10, front-opening unified pods (FOUPs) 31 (described later) that can each store multiple substrates W are loaded and unloaded in an ambient atmosphere, and the substrates W are transferred to and from the loadlock modules 20*a* and 20*b*. In the decompressor 11, the substrates W undergo intended processing in a decompressed atmosphere (e.g., under a vacuum atmosphere) and are transferred to and from the loadlock modules 20*a* and 20*b*.

The loadlock module 20*a* (e.g., loadlocker, loadlock assembly or loadlock connector) includes a stage 21*a* for supporting a substrate W in its internal space (e.g., the internal space of the loadlock module 20*a*). The loadlock module 20*a* temporarily holds, on the stage 21*a*, a substrate W transferred from a loader module 30 (e.g., loader assembly) (described later) in the atmospheric unit 10 to be delivered to a transfer module 50 (e.g., transfer assembly) (described later) in the decompressor 11.

The loadlock module 20*a* is connected to the loader module 30 (described later) with a gate valve 22*a*. The loadlock module 20*a* is connected to the transfer module 50 (described later) with a gate valve 23*a*. The gate valve 22*a* maintains airtightness between the loadlock module 20*a* and the loader module 30 and connects the loadlock module 20*a* and the loader module 30. The gate valve 23*a* maintains airtightness between the loadlock module 20*a* and the transfer module 50 and connects the loadlock module 20*a* and the transfer module 50.

The loadlock module 20*a* is connected to a gas supply to supply a gas and a gas discharger to discharge a gas. The gas supply and the gas discharger allow the internal space of the loadlock module 20*a* to switch between in an ambient atmosphere and in a decompressed atmosphere. In other words, the loadlock module 20*a* allows the substrate W to be appropriately transferred between the atmospheric unit 10 in an ambient atmosphere and the decompressor 11 in a decompressed atmosphere.

The loadlock module 20*b* has the same structure as the loadlock module 20*a*. More specifically, the loadlock module 20*b* includes a stage 21*b* for supporting a substrate W, a gate valve 22*b* adjacent to the loader module 30, and a gate valve 23*b* adjacent to the transfer module 50. The loadlock module 20*b* temporarily holds, on the stage 21*b*, a substrate W transferred from the transfer module 50 (described later) in the decompressor 11 to be delivered to the loader module 30 (described later) in the atmospheric unit 10.

The atmospheric unit 10 includes the loader module 30 including a transferrer 40 (described later) and load ports 32 on which the FOUPs 31 are placed. Each FOUP 31 can store multiple substrates W. The loader module 30 may be connected to an orienter module that adjusts the horizontal orientation of a substrate W and a buffer module that temporarily stores multiple substrates W.

The loader module 30 includes a rectangular housing, with its internal space maintained in an ambient atmosphere. However, the loader module 30 can have any shape. The multiple load ports 32, for example, four load ports 32, are aligned on one side surface, which includes long sides of the housing of the loader module 30. The loadlock modules 20*a* and 20*b* are aligned on another side surface, which includes the other long sides of the housing of the loader module 30.

The housing of the loader module 30 contains the transferrer 40 for transferring a substrate W. The transferrer 40 includes a transfer arm 41 that supports a substrate W during transfer, a rotary stand 42 supporting the transfer arm 41 in a rotatable manner, and a base 43 on which the rotary stand 42 is mounted.

The decompressor 11 includes the transfer module 50 that transfers a substrate W and processing modules 60 that each perform intended processing on a substrate W. The internal spaces of the transfer module 50 and the processing modules 60 are maintained in a decompressed atmosphere. The decompressor 11 includes multiple processing modules 60, for example, six processing modules 60, for one transfer module 50. The number of processing modules 60 and their arrangement are not limited to those in the present embodiment and may be set as appropriate. The decompressor 11 may include at least one processing module including a substrate support 62 (described later).

The transfer module 50 as a substrate transfer module includes a decompressed transfer chamber 51 as a substrate transfer chamber defined by a polygonal housing, or a rectangular housing as viewed in plan in the illustrated example. The decompressed transfer chamber 51 is connected to the loadlock module 20*a* with the gate valve 23*a*, to the loadlock module 20*b* with the gate valve 23*b*, and to the processing modules 60 with gate valves 60*a*. In other words, the transfer module 50 is located adjacent to the loadlock modules 20*a* and 20*b* and the six processing modules 60.

The transfer module 50 transfers a substrate W loaded into the loadlock module 20*a* to one of the processing modules 60, and unloads a substrate W processed as intended in the processing module 60 to the atmospheric unit 10 through the loadlock module 20*b*.

Each processing module 60 includes a processing chamber 61, a substrate support 62, a first temperature sensor 63, and a plasma generator 64. The processing chamber 61 has a plasma processing space. The processing chamber 61 has at least one gas inlet for supplying at least one process gas into the plasma processing space and at least one gas outlet for discharging the gas from the plasma processing space. The gas inlet connects to a gas supply unit. The gas outlet connects to an exhaust system. The substrate support 62 is located in the plasma processing space and has a substrate support surface for supporting a substrate. The first temperature sensor 63 measures the temperature of the substrate support 62, or more specifically, the temperature of a substrate W supported on the substrate support 62.

The plasma generator 64 generates plasma from at least one process gas supplied into the plasma processing space. The plasma generated in the plasma processing space may be capacitively coupled plasma (CCP), inductively coupled plasma (ICP), electron cyclotron resonance (ECR) plasma, helicon wave plasma (HWP), or surface wave plasma (SWP). Various plasma generators including an alternating current (AC) plasma generator and a direct current (DC)

plasma generator may be used. In one embodiment, an AC signal (e.g., AC power) used in the AC plasma generator has a frequency in a range of 100 kHz to 10 GHz. Thus, the AC signal includes a radio-frequency (RF) signal and a microwave signal. In one embodiment, the RF signal has a frequency in a range of 100 kHz to 150 MHz.

The transfer module 50 includes a transferrer 70 (e.g., second transferrer) in its internal space. The transferrer 70 can operate as a robotic substrate transferrer can hold and transfer a substrate W. The transferrer 70 transfers a substrate W between the loadlock module 20*a* and each processing module 60 and between the loadlock module 20*b* and each processing module 60. In one example, the transferrer 70 is mounted on a stage 71 with a base 101 (described later) between the transferrer 70 and the stage 71.

Figure 2:
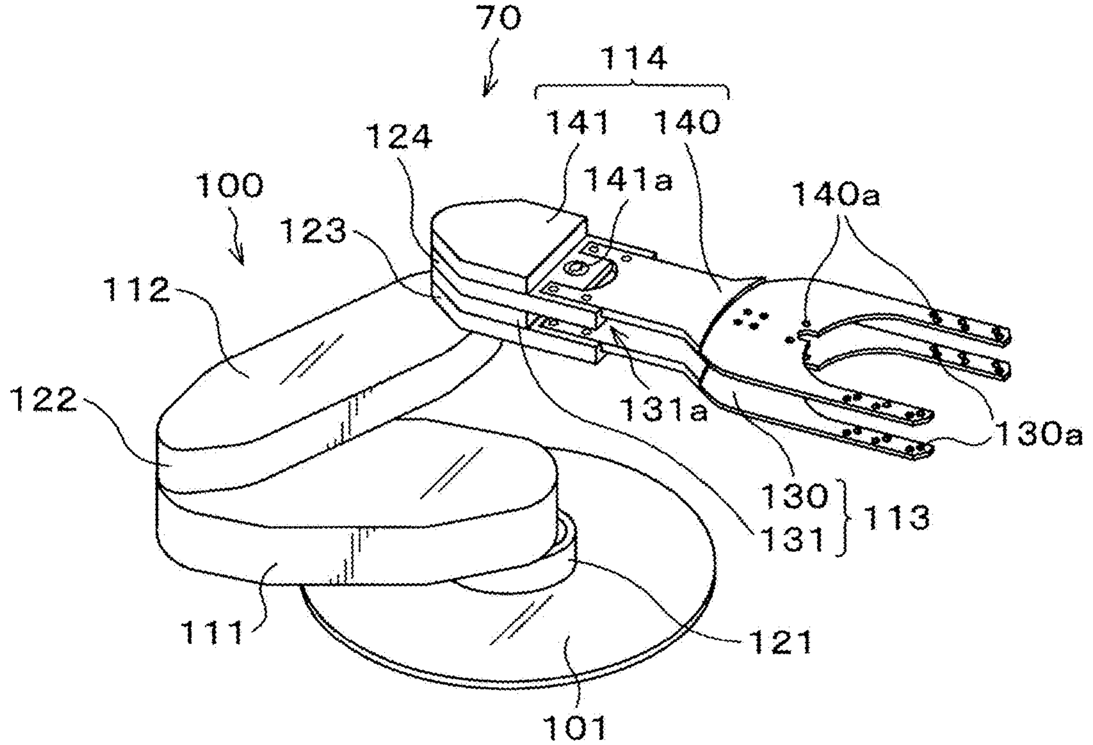
FIG. 2 is a schematic perspective view of a transferrer in the embodiment.
Figure 3:
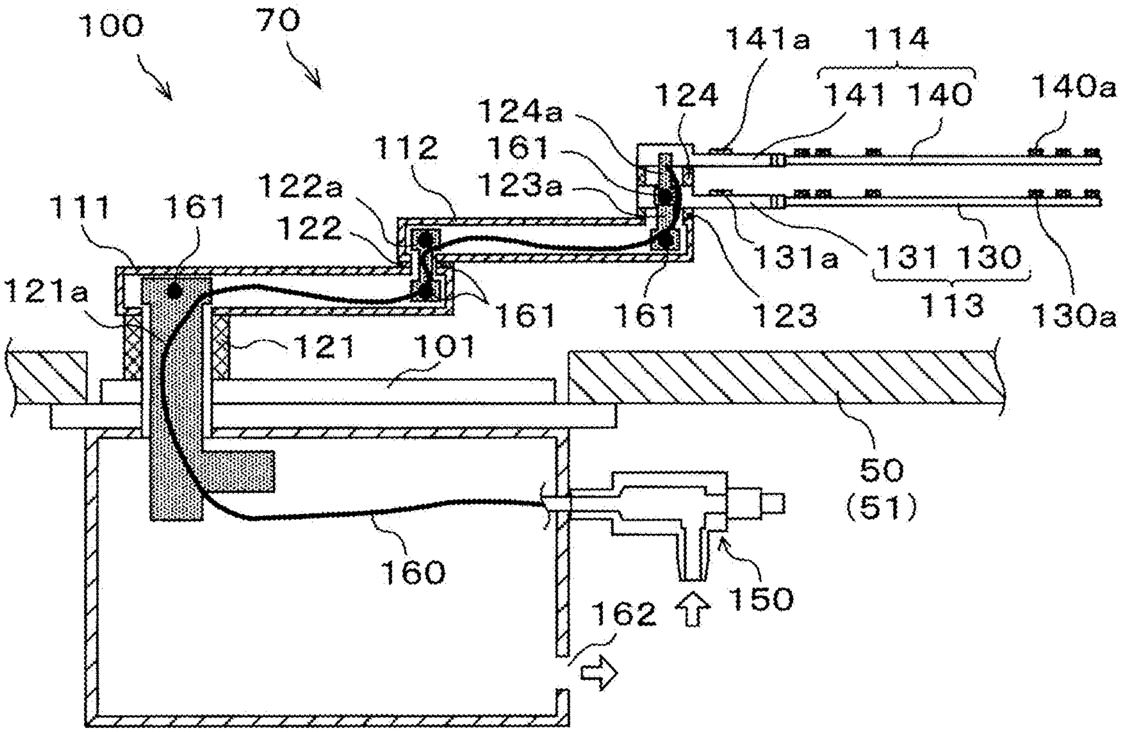
FIG. 3 is a schematic sectional view of the transferrer in the embodiment.

FIG. 2 is a schematic perspective view of the transferrer 70 in the present embodiment. FIG. 3 is a schematic longitudinal sectional view of the transferrer 70.

The transferrer 70 includes a transfer arm 100 that holds and moves a substrate W and the base 101 supporting the transfer arm 100. The transfer arm 100 is an articulated arm with a link arm structure including multiple arms, for example, four arms (a first arm 111 to a fourth arm 114), linked to one another.

The first arm 111 has a basal end (e.g., proximal end) connected to the base 101 in a rotatable manner and a distal end (e.g., second end) connected to the second arm 112. The second arm 112 has a basal end connected to the first arm 111 in a rotatable manner and a distal end connected to the third arm 113 and the fourth arm 114. The third arm 113 and the fourth arm 114 have their basal ends connected to the second arm 112 in a rotatable manner. The third arm 113 is located below the fourth arm 114.

A first joint 121 is located between the basal end of the first arm 111 and the base 101. The first joint 121 includes, in its internal space, a drive 121*a* including a rotary member such as a motor. The first arm 111 is rotatable (pivotable) about the first joint 121 relative to the base 101 as driven by the drive 121*a*.

A second joint 122 is located between the basal end of the second arm 112 and the distal end of the first arm 111. The second joint 122 includes, in its internal space, a drive 122*a* including a rotary member such as a motor. The second arm 112 is rotatable (pivotable) about the second joint 122 relative to the first arm 111 as driven by the drive 122*a*.

The first arm 111 and the second arm 112 each have a hollow (outlined portions in the arms in FIG. 3) as its internal space in an ambient atmosphere. Various components are accommodated in the hollows. For example, the rotary members included in the drives 121*a* and 122*a* (described above) and rotary members included in drives 123*a* and 124*a* (described later) are accommodated in the hollows as shown in FIG. 3. For example, electrical cables (not shown) connected to the drives 121*a*, 122*a*, 123*a*, and 124*a*, electrical cables (not shown) connected to deposit detectors 131*a* and 141*a* (described later), or an air tube 160 (described later) connected to an air cooler 150 (described later) are accommodated in the hollows. For example, a vibration meter (not shown) to measure the vibration of the transfer arm 100 and second temperature sensors 161 (described later) to measure the internal temperature of the transfer arm 100 are accommodated in the hollows. These components are not exposed outside the arms.

The third arm 113 includes a fork 130 (first end-effector) that holds a substrate W on its upper surface and a hand 131 supporting the fork 130. The fork 130 is located in a distal end portion of the third arm 113. The hand 131 is located in a basal end portion of the third arm 113. The third arm 113 is located below the fourth arm 114 to be at the same position as the fourth arm 114 as viewed in plan, or in other words, to be aligned in the vertical direction. In other words, the third arm 113 and the fourth arm 114 can simultaneously hold two substrates W in a manner aligned in the vertical direction. The fork 130 in the third arm 113 serves as a lower pick in the transferrer 70.

The fork 130 as a substrate holder has a basal end connected to the hand 131 and a distal end branching into two portions. The fork 130 includes multiple high-temperature pads 130*a* on its upper surface. The fork 130 suctions and holds a substrate W with the multiple high-temperature pads 130*a*. The high-temperature pads 130*a* are formed from a material that allows continuous holding of a substrate W in a temperature range of, for example, 0 to 300° C. The high-temperature pads 130*a* can thus suction and hold a high-temperature substrate W processed in a processing module 60. Examples of the material for the high-temperature pads 130*a* include a fluororesin (eg, fluorine rubber) such as D0270 or K8900. However, any material that allows continuous holding of a substrate W in the above temperature range may be used as a material for the high-temperature pads 130*a*. The shape of the fork 130 is not limited to the shape in the present embodiment, and may be, for example, plate-like.

The hand 131 as a sensor receiver has a basal end connected to the distal end of the second arm 112 with a third joint 123 (described later) and a distal end connected to the fork 130 described above. The hand 131 includes the deposit detector 131*a* on its upper surface adjacent to its distal end (adjacent to the fork 130). The deposit detector 131*a* measures the amount of deposits (e.g., reaction products) adhering to the upper surface of a substrate W held by the fork 130 or the upper surfaces of the high-temperature pads 130*a* on the fork 130. In other words, the deposit detector 131*a* is located adjacent to the basal end of the fork 130 (e.g., first end-effector). The deposit detector 131*a* may have its upper surface substantially flush with the upper surfaces of the high-temperature pads 130*a* on the fork 130. The deposit detector 131*a* may be, for example, a quartz crystal microbalance (QCM) sensor. However, any sensor that can detect the amount of deposits particularly on the high-temperature pads 130*a* may be used. The electrical cables connected to the deposit detector 131*a* are located in the hollows in the first arm 111 and the second arm 112 as described above and buried inside the third arm 113. The electrical cables are thus not exposed outside the arms.

The third joint 123 is located between the basal end of the third arm 113 and the distal end of the second arm 112, or more specifically, between the basal end of the hand 131 and the distal end of the second arm 112. The third joint 123 includes the drive 123*a* including a rotary member such as a motor in its internal space. The third arm 113 is rotatable (pivotable) about the third joint 123 relative to the second arm 112 as driven by the drive 123*a*.

The third arm 113 may further include a substrate sensor to detect the position of a substrate W, a support sensor to detect the position of the substrate support 62 in the processing module 60, or an atmosphere detector to detect the atmospheric state in the transfer module 50 or in the processing module 60.

The fourth arm 114 includes a fork 140 (e.g., second end-effector) that holds a substrate W on its upper surface and a hand 141 supporting the fork 140. The fork 140 is located adjacent to the distal end (e.g., second end) of the fourth arm 114. The hand 141 is located adjacent to the basal end of the fourth arm 114. As described above, the fourth arm 114 is located above the third arm 113 in a manner aligned in the vertical direction (e.g., the fourth arm 114 can overlap the third arm 113). The fourth arm 114 serves as an upper pick in the transferrer 70.

The fork 140 as a substrate holder has a basal end (e.g., proximal end or first end) connected to the hand 141 and a distal end (e.g., second end) branching into two portions. The fork 140 includes multiple low-temperature pads 140*a* on its upper surface. The fork 140 suctions and holds a substrate W with the multiple low-temperature pads 140*a*. The low-temperature pads 140*a* are formed from a material that allows continuous holding of a substrate W in a temperature range of, for example, −60° C. to about room temperature, or specifically, less than 0° C. The low-temperature pads 140*a* can thus suction and hold a low-temperature substrate W processed in the processing module 60. Examples of the material for the low-temperature pads 140*a* include a silicone resin (e.g., silicone rubber). However, any material that allows continuous holding of a substrate W in the temperature range described above may be used as a material for the low-temperature pads 140*a*. The shape of the fork 140 is not limited to the shape in the present embodiment, and may be, for example, plate-like.

The hand 141 as a sensor receiver has the same structure as the hand 131 in the third arm 113 described above. More specifically, the hand 141 has a basal end connected to the distal end of the second arm 112 and a distal end connected to the fork 140, and includes the deposit detector 141*a* on its upper surface. The deposit detector 141*a* is located adjacent to the basal end of the fork 140 (e.g., second end-effector). The deposit detector 141*a* may be, for example, a QCM sensor.

A fourth joint 124 is located between the basal end (e.g., proximal end or first end) of the fourth arm 114 and the distal end (e.g., second end) of the second arm 112, or more specifically, between the basal end (e.g., proximal end or first end) of the hand 141 and the basal end (e.g., proximal end or first end) of the hand 131 in the third arm 113. The third joint 123 and the fourth joint 124 are at the same position as viewed in plan. The fourth joint 124 includes the drive 124*a* including a rotary member, such as a motor, in its internal space. The fourth arm 114 is rotatable (e.g., pivotable) about the fourth joint 124 relative to the second arm 112 as driven by the drive 124*a*.

The transferrer 70 may include any number of deposit detectors. The deposit detector may be located on each of the hands 131 and 141 as described above or on either the hand 131 or the hand 141. For example, other deposit detectors may be located on the forks 130 and 140 in addition to the hands 131 and 141.

The air cooler 150 as a cooling gas supply is located below the transferrer 70, or more specifically, below the transfer module 50 as shown in FIG. 3. The air cooler 150 cools, in its internal space, dry air introduced through its inlet and supplies, through the air tube 160 connected to its outlet, the dry air as cooling air into the internal space of the transferrer 70, or more specifically, the hollows in the first arm 111 and the second arm 112. The cooling air supplied into the transferrer 70 cools the transferrer 70 that may have a higher internal temperature when, for example, the drives 121*a*, 122*a*, 123*a*, and 124*a* operate. The cooling air supplied for cooling the transferrer 70 is discharged outside through an outlet 162 below the transferrer 70, or more specifically, below the transfer module 50 as shown in FIG. 3.

Figure 4:
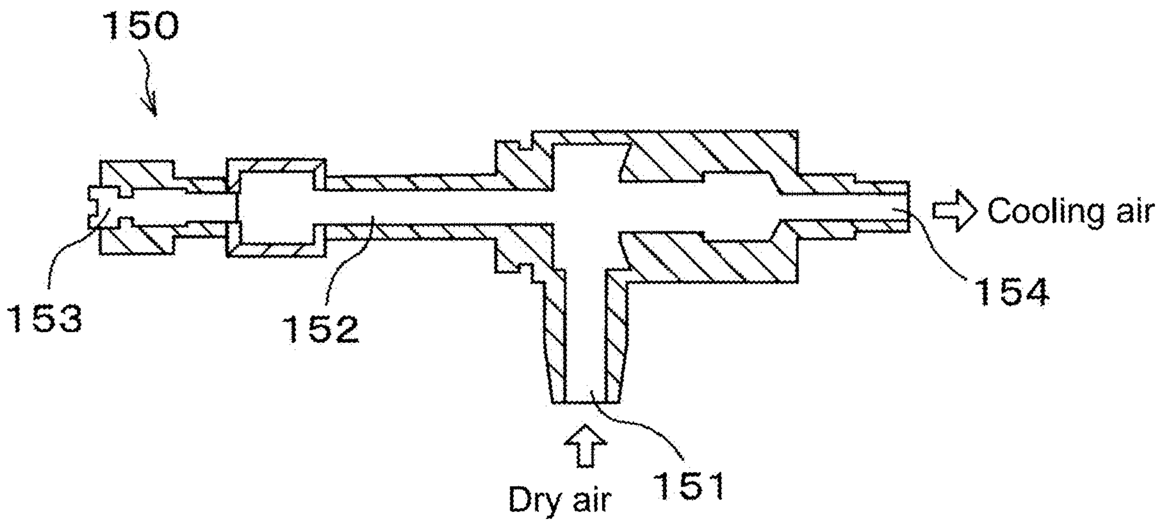
FIG. 4 is a schematic sectional view of an air cooler in the embodiment.

FIG. 4 is a schematic sectional view of the air cooler 150. As shown in FIG. 4, the air cooler 150 includes an air inlet hole 151, a cooling assembly 152, a temperature adjustment valve 153, and an air outlet hole 154.

The air inlet hole 151 introduces dry air into the air cooler 150 as described above. The dry air to be introduced may be, for example, air as a utility for the factory. The cooling assembly 152 cools the dry air introduced into the air cooler 150 through the air inlet hole 151. The cooling assembly 152 may have any structure that can cool the dry air to an intended temperature. The temperature adjustment valve 153 as a temperature adjuster is used to adjust the temperature of the dry air cooled by the cooling assembly 152, or in other words, the temperature of the cooling air to be discharged through the air outlet hole 154 (described later). The operation of the temperature adjustment valve 153 may be controlled manually or may be controlled automatically by, for example, the controller 2 (described later). The operation of the temperature adjustment valve 153 may be controlled based on, for example, measurement results obtained by the second temperature sensors 161 in the hollows in the transfer arm described above, or in other words, the internal temperature of the transferrer 70. The air outlet hole 154 is connected to the air tube 160 through which cooling air is supplied into the hollows in the first arm 111 and the second arm 112 as described above.

The air tube 160 and the second temperature sensors 161 may be located in the internal space of the transferrer 70, or more specifically, in the internal space of the transfer arm 100 as the hollow as described above.

The air tube 160 is routed in the hollows in the transfer arm 100 with one end (e.g., first end) connected to the air outlet hole 154 in the air cooler 150 and the other end (e.g., second end) located adjacent to the distal end (e.g., second end) of the transfer arm 100, for example, adjacent to the fourth joint 124. In other words, the air tube 160 introduces cooling air supplied from the air cooler 150 from near the distal end of the transfer arm 100 into the hollows in the transfer arm 100. The position to be supplied with the cooling air is not limited. The cooling air may be supplied toward, for example, near the distal end of the transfer arm 100 as described above. The cooling air may be supplied toward the joints (the first joint 121 to the fourth joint 124) in the transfer arm 100 to be directly supplied toward the drives 121*a* to 124*a*, which generate heat.

As shown in FIG. 3, the second temperature sensors 161 are located in the shafts (the first joints 121 to the fourth joint 124 described above) of the transfer arm 100. The second temperature sensors 161 monitor, over time, the increase in the temperature of the transferrer 70 caused by the drives 121*a* to 124*a* in the hollows described above, or more specifically, the increase in the internal temperature of the transfer arm 100. The internal temperature of the transfer arm 100 is used to, for example, control the temperature of the cooling air output from the air cooler 150.

In the plasma processing apparatus 1 in the present embodiment, the air cooler 150 and the second temperature sensors 161 described above correspond to a temperature control system associated with the technique according to an aspect of the disclosure.

Referring back to FIG. 1, the plasma processing system includes the controller 2 as described above. The controller 2 processes computer-executable instructions that cause the plasma processing apparatus 1 to perform various steps described in one or more embodiments of the disclosure. The controller 2 may control the components of the plasma processing apparatus 1 to perform various steps described herein. In one embodiment, some or all of the components of the controller 2 may be included in the plasma processing apparatus 1. The controller 2 may include a processor **2*al*, a storage 2*a*2, and a communication interface 2*a*3. The controller 2 is implemented by, for example, a computer 2*a*. The processor 2*al* may perform various control operations by reading a program from the storage 2*a*2 and executing the read program. This program may be prestored in the storage 2*a*2 or may be obtained through a medium as appropriate. The obtained program is stored into the storage 2*a*2, read from the storage 2*a*2, and executed by the processor 2*al*. The medium may be one of various storage media readable by the computer 2*a*, or a communication line connected to the communication interface 2*a*3. The processor 2*al* may be a central processing unit (CPU). The storage 2*a*2 may include a random-access memory (RAM), a read-only memory (ROM), a hard disk drive (HDD), a solid-state drive (SSD), or a combination of these. The communication interface 2*a*3 may communicate with the plasma processing apparatus 1** through a communication line such as a local area network (LAN). The storage media described above may be transitory or non-transitory.

Although the exemplary embodiments have been described above, the embodiments are not restrictive, and various additions, omissions, substitutions, and changes may be made. The components in the different embodiments may be combined to form another embodiment.

Wafer Processing with Plasma Processing Apparatus 1

The wafer processing performed in the plasma processing apparatus 1 described above will now be described.

First, a substrate W is removed from an intended FOUP 31 with the transferrer 40 and loaded into the loadlock module **20*a*. The loadlock module 20*a* is then sealed and decompressed. The internal space of the loadlock module 20*a* is then connected with the internal space of the transfer module 50**.

The substrate W is then held by the transferrer 70 and transferred from the loadlock module **20*a* to the transfer module 50. The unprocessed substrate W transferred from the loadlock module 20*a* has a room temperature. The substrate W may thus be held by either the fork 130 or the fork 140 in the transferrer 70, or more specifically, by either the high-temperature pads 130*a* or the low-temperature pads 140*a***.

The gate valve **60*a* in one processing module 60 is then opened, and the substrate W is loaded into the processing module 60 by the transferrer 70. The gate valve 60*a* is then closed, and intended processing is performed on the substrate W in the processing module 60**.

When the intended processing on the substrate W is complete, the gate valve **60*a* is opened, and the substrate W is unloaded from the processing module 60 by the transferrer 70. The gate valve 60*a*** is then closed.

When high-temperature processing is performed on the substrate W in the processing module 60, the substrate W unloaded from the processing module 60 may have a temperature of, for example, 200° C. or higher. When low-temperature processing is performed on the substrate W in the processing module 60, the substrate W unloaded from the processing module 60 may have a temperature of, for example, less than 0° C. As described above, the substrate W unloaded from the processing module 60 has a temperature that greatly varies based on the type or conditions of the processing performed in the processing module 60. When the processed substrate W as a transfer target has a temperature deviating from the appropriate temperature range of holding pads on a fork in the transferrer 70, the substrate may not be transferred appropriately as described above. More specifically, when the substrate W has a temperature, for example, below the appropriate temperature range of the holding pads, the holding pads may not be able to continuously hold the substrate W, thus causing slippage of the substrate W. The transfer arm is thus to be moved at a lower speed. When the substrate W has a temperature, for example, above the appropriate temperature range of the holding pads, the holding pads may be damaged and cannot hold the substrate W.

The transferrer 70 in the present embodiment includes the fork 130 including the high-temperature pads **130*a* and the fork 140 including the low-temperature pads 140*a* as described above. In other words, one of the forks 130 and 140 is used as a transfer arm for a high-temperature substrate (the fork 130 in the embodiment), and the other of the forks 130 and 140 is used as a transfer arm for a low-temperature substrate (the fork 140 in the embodiment). Transfer conditions of the transferrer 70 can thus be preset to cause the high-temperature arm (the third arm 113 including the fork 130) to be used to unload a substrate W from a processing module 60 for high-temperature processing and the low-temperature arm (the fourth arm 114 including the fork 140) to be used to unload a substrate W from a processing module 60 for low-temperature processing. This allows appropriate unloading of a substrate W from a processing module 60** independently of the temperature of the processed substrate W.

The transfer fork to hold a substrate W may be preselected based on, for example, the type of processing performed in each processing module 60, or specifically, based on a process recipe. In this case, in response to a change in the processing performed in a processing module 60, the settings for selecting a fork in the process recipe is to be changed manually. The transfer fork to hold a substrate W may thus be selected based on measurement results obtained by the first temperature sensor 63 in a processing module 60 described above. In other words, the transfer fork may be automatically selected based on the temperature of the substrate support 62 supporting the substrate W, or specifically, the temperature of the substrate W as a transfer target. This allows automatic selection of a transfer fork based on the measured temperature of a substrate W as a transfer target independently of the type or conditions of the substrate processing performed in the processing module 60, thus eliminating a manual setting change performed in response to a change in the processing.

In the present embodiment, the transferrer 70 includes two arms in total, or in other words, one high-temperature arm to transfer a high-temperature substrate W and one low-temperature arm to transfer a low-temperature substrate W. In some embodiments, the transferrer 70 may include a different number of high-temperature arms and a different number of low-temperature arms. For example, although the structure including one high-temperature arm and one low-temperature arm transfers a single substrate W in the decompressor 11 in the plasma processing apparatus 1 in the above embodiment, the structure may include two or more high-temperature arms and two or more low-temperature arms to simultaneously transfer two or more substrates W.

After unloaded from the processing module 60, the substrate W is then loaded into the loadlock module **20*b* by the transferrer 70. In response to the substrate W being loaded into the loadlock module 20*b*, the loadlock module 20*b* is sealed and vented to the atmosphere. The substrate W having a high temperature or a low temperature after processed in the processing module 60 is temporarily held in the loadlock module 20***b*, and the temperature of the substrate W is adjusted to about room temperature. When the temperature of the substrate W is adjusted to about room temperature, the internal space of the loadlock module 20*b* is connected with the internal space of the loader module 30.

The substrate W is then held by the transferrer 40 and returned from the loadlock module 20*b* through the loader module 30 to an intended FOUP 31 for storage. This completes the wafer processing in the plasma processing apparatus 1.

Advantageous Effects and Others

In the present embodiment, as described above, the high-temperature arm (fork 130) or the low-temperature arm (fork 140) in the transferrer 70 is appropriately selected, thus allowing a substrate W to be transferred appropriately, independently of the temperature of the substrate W after being processed in the processing module 60, or in other words, independently of the type or conditions of the substrate processing performed in a processing module 60. More specifically, a processed high-temperature substrate W is held by the fork 130 with the high-temperature pads 130*a*, thus reducing the likelihood that the holding pads are damaged when holding the high-temperature substrate. The high-temperature substrate can thus be transferred appropriately. A processed low-temperature substrate W is held by the fork 140 with the low-temperature pads 140*a*, thus reducing the likelihood of slippage of the substrate W being held. Thus, the moving speed of the transfer arm is not to be decreased as in a known structure.

In the present embodiment, the first temperature sensors 63 may each measure the temperature of a substrate W as a transfer target before the substrate W is unloaded from the corresponding processing module 60. This allows the high-temperature arm or the low-temperature arm to be selected appropriately and automatically to unload the substrate W in the transferrer 70, independently of the type or conditions of the substrate processing performed in the processing module 60, or in other words, the temperature of the substrate W as a transfer target. In this case, the high-temperature arm or the low-temperature arm can be selected automatically in response to a change in the processing performed in the processing module 60, thus eliminating a manual recipe change performed by, for example, an operator.

As described above, the articulated transferrer 70 may have a higher temperature when the drives 121*a* to 124*a* included in the shafts (the first joint 121 to the fourth joint 124) in the transferrer 70 generate heat in operation. The transferrer 70 having a higher temperature may have lower accuracy of transferring the substrate W as described above. In a known structure, to reduce the likelihood of lower accuracy of transferring substrates resulting from the higher temperature, dry air for cooling a transferrer is supplied into the transferrer, or more specifically, into a transfer arm. Dry air is to be supplied into the transferrer at low consumption (at a low flow rate) for environmental concerns. However, the reduced flow rate can cause insufficient cooling and increase the temperature of the transferrer.

In the above embodiment, the air cooler 150 is located on a supply path of the dry air to cool dry air for cooing the transferrer as shown in FIG. 3. In other words, cooling air cooled by the air cooler 150 is supplied into the transfer arm 100 in the transferrer 70, instead of substantially room-temperature dry air being supplied as in a known structure. In the present embodiment, the transferrer 70 can be cooled with dry air at a lower flow rate than in a known structure. This can reduce the likelihood of lower accuracy of transferring the substrate W resulting from the higher temperature while reducing consumption of dry air.

As described above, the air cooler 150 may control the temperature of cooling air to be supplied into the transfer arm 100 based on the measurement results obtained by the second temperature sensors 161 (refer to FIG. 3) located in the shafts in the transferrer 70, or in other words, the internal temperature of the transfer arm 100. The temperature of the cooling air is controlled with, for example, the temperature adjustment valve 153 in the air cooler 150. In this manner, with the internal temperature of the transferrer 70 monitored by the second temperature sensors 161, the temperature of the cooling air to be discharged can be controlled in response to an increase in the internal temperature of the transferrer 70. Thus, the cooling air is less likely to cause excess or insufficient cooling of the transferrer 70, optimizing the consumption of the dry air while reducing the likelihood of lower accuracy of transferring the substrate W.

As described above, the operation of the temperature adjustment valve 153 may be controlled manually or automatically based on the measurement results obtained by the second temperature sensors 161. To optimize the temperature of the cooling air and the consumption of the dry air, the operation of the temperature adjustment valve 153 may be controlled automatically. In this case, the operation of the temperature adjustment valve 153 may be controlled by, for example, the controller 2.

In the plasma processing apparatus 1 in the above embodiment, deposits may adhere to the holding pads (the high-temperature pads 130*a* and the low-temperature pads 140*a*) on the forks 130 and 140 when, for example, air is drawn in as the gate valve 60*a* in a processing module 60 is opened or when, for example, a substrate W is transferred from the atmospheric unit 10. Such deposits adhering to the holding pads may cause slippage of a substrate as described above. In a known structure, to reduce the likelihood of slippage of a substrate caused by adhesion of deposits, the transfer module 50 and the transferrer 70 are cleaned (to remove adhering deposits). However, the amount of deposits adhering to the transferrer 70 changes in response to, for example, the type of the substrate processing performed in each processing module 60 or the operating rate of each processing module 60. This causes difficulty in determining appropriate timing of cleaning.

Figure 5:
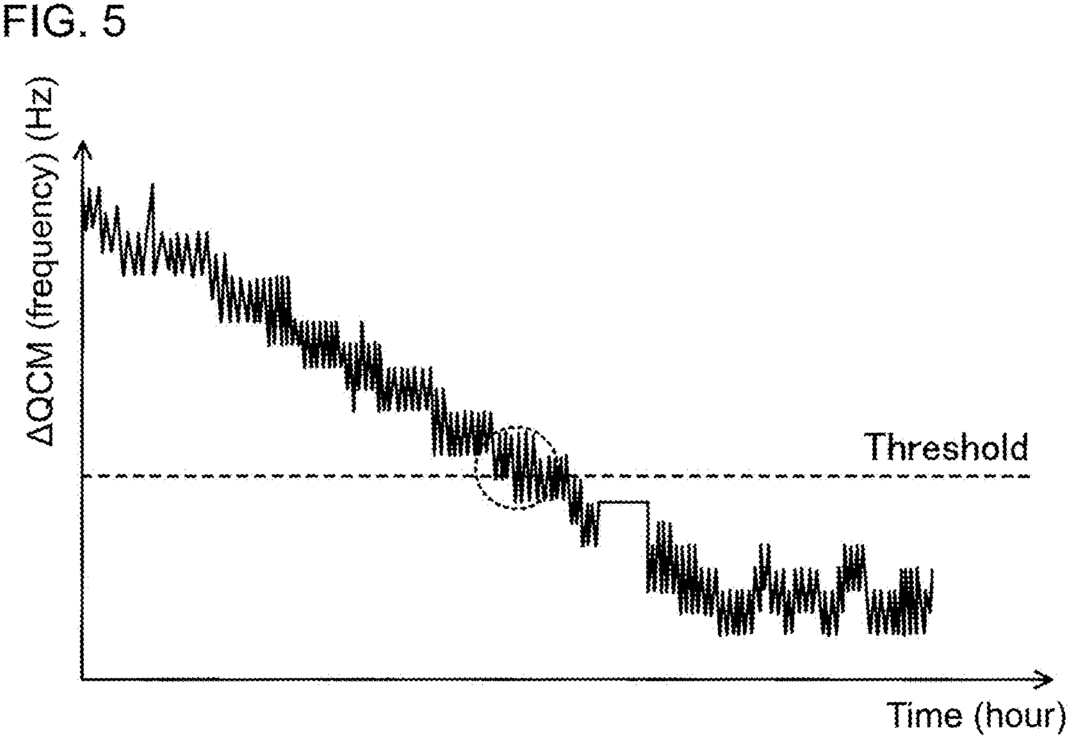
FIG. 5 is a graph showing example measurement results obtained by deposit detectors.

In the above embodiment, as shown in FIGS. 2 and 3, the deposit detector 131*a* (QCM sensor) is located on the hand 131 in the third arm 113 to detect the amount of deposits adhering to the fork 130, or more specifically, the high-temperature pads 130*a*, and the deposit detector 141*a* (QCM sensor) is located on the hand 141 in the fourth arm 114 to detect the amount of deposits adhering to the fork 140, or more specifically, the low-temperature pads 140*a*. The QCM sensors as the deposit detectors 131*a* and 141*a* can detect the amount of deposits adhering to the deposit detectors 131*a* and 141*a* based on a decrease in a resonance frequency (the vertical axis in FIG. 5) caused by deposits adhering to the surfaces of the crystal plates in the QCM sensors, as shown in FIG. 5.

In the present embodiment, the timing to clean the transfer module 50 (transferrer 70) is controlled based on the resonance frequency (to detect the amount of adhering deposits) detected by the deposit detectors 131*a* and 141*a* as described above. More specifically, a threshold (the dashed line in FIG. 5) as a reference of the timing to start cleaning is predetermined. At the timing (e.g., the portion enclosed with the dashed circle in FIG. 5) at which the detected resonance frequency (to determine the amount of adhering deposits)

falls below the threshold, an instruction for starting cleaning the transfer module 50 (transferrer 70) is provided.

In the present embodiment, as described above, the timing of cleaning can be controlled based on the amount of adhering deposits visualized by the deposit detectors 131*a* and 141*a*. Thus, cleaning can be appropriately performed at the timing at which an intended amount of deposits is measured, independently of, for example, the type of the substrate processing performed in the processing module 60 or the operating rate of the processing module 60. While being cleaned, the transfer module 50 cannot transfer a substrate W, and the operation of the plasma processing apparatus 1 is stopped. In the present embodiment, cleaning is performed at timing at which the intended amount of deposits accumulates. This can minimize the cleaning times of the transfer module 50, or in other words, the downtime of the plasma processing apparatus 1.

In the present embodiment, the deposit detector 131*a* described above is located on the upper surface of the hand 131 adjacent to the fork 130 on which the high-temperature pads 130*a* are located, and the deposit detector 141*a* described above is located on the upper surface of the hand 141 adjacent to the fork 140 on which the low-temperature pads 140*a* are located. The deposit detector 131*a* has its upper surface substantially flush with the upper surfaces of the high-temperature pads 130*a*. The deposit detector 141*a* has its upper surface substantially flush with the upper surfaces of the low-temperature pads 140*a*. In the present embodiment, the deposit detectors 131*a* and 141*a* are located under substantially the same conditions (e.g., the position and the height) as the high-temperature pads 130*a* and the low-temperature pads 140*a*. Thus, the deposit detector 131*a* has substantially the same amount of adhering deposits as the high-temperature pads 130*a*, and the deposit detector 141*a* has substantially the same amount of adhering deposits as the low-temperature pads 140*a*. This allows the amount of deposits on the high-temperature pads 130*a* or the low-temperature pads 140*a* that may cause slippage of a substrate to be detected more appropriately.

In the above embodiment, the timing to clean the transfer module 50 (transferrer 70) is controlled based on the amount of deposits adhering to the deposit detectors 131*a* and 141*a*, or in other words, the degree of the deposit detectors 131*a* and 141*a* being contaminated. In some embodiments, the timing of cleaning may be controlled based on the states of the internal spaces of the processing modules 60 in place of or in addition to the amount of deposits described above. More specifically, the amount of deposits adhering to the high-temperature pads 130*a* and the low-temperature pads 140*a* may be proportional to the contaminated degree of the internal space of the processing modules 60 during transfer of the substrates W. In other words, for example, a larger amount of deposits adhering to or floating in the internal spaces of the processing modules 60 may increase the amount of deposits adhering to the high-temperature pads 130*a* and the low-temperature pads 140*a*, whereas a smaller amount of deposits adhering to or floating in the internal spaces of the processing modules 60 may reduce the amount of deposits adhering to the high-temperature pads 130*a* and the low-temperature pads 140*a*. Thus, the contaminated degrees (the amount of deposits) of the internal spaces of the processing modules 60 may be detected by other deposit detectors to determine whether the transfer module 50 (transferrer 70) is to be cleaned based on the detection results obtained by the other deposit detectors.

Although the exemplary embodiments have been described above, the embodiments are not restrictive, and various additions, omissions, substitutions, and changes may be made. The components in the different embodiments may be combined to form another embodiment.

For example, the transferrer 70 in the embodiment is included in the plasma processing system as a substrate processing system in the above embodiment. However, the type of the substrate processing system is not limited to the plasma processing system. The transferrer 70 in the embodiment may be included in any substrate processing system that performs high-temperature processing and low-temperature processing.

The module in which the transferrer 70 is located may not be a vacuum transfer module such as the transfer module 50 described above, and may be a module that transfers substrates W in an ambient atmosphere.

REFERENCE SIGNS LIST

1 Plasma processing apparatus
2 Controller
50 Transfer module
51 Decompressed transfer chamber
60 Processing module
61 Processing chamber
62 Substrate support
63 First temperature sensor
70 Transferrer
130 Fork
130*a* High-temperature pad
131*a* deposit detector
140 Fork
140*a* Low-temperature pad
141*a* deposit detector
150 Air cooler
152 Cooling assembly
161 Second temperature sensor

The invention claimed is:

1. A substrate transfer system, comprising:
a substrate processing assembly;
a substrate transfer assembly connected to the substrate processing assembly; and
circuitry,
the substrate processing assembly including:
 a substrate processing chamber;
 a substrate support in the substrate processing chamber; and
 a first temperature sensor configured to measure a temperature of the substrate support,
the substrate transfer including:
 a substrate transfer chamber;
 a robotic substrate transferrer in the substrate transfer chamber; and
 a temperature control system,
the robotic substrate transferrer including:
 a first end-effector including a first holding pad configured to hold a first substrate processed in the substrate processing assembly;
 a second end-effector including a second holding pad configured to hold a second substrate processed at a lower temperature than the first substrate in the substrate processing assembly; and
 a deposit detector located adjacent to at least one of the first end-effector or the second end-effector,
the temperature control system including:
 a cooling gas supply configured to supply a cooling gas into the robotic substrate transferrer;

a second temperature sensor configured to measure a temperature of an internal space of the robotic substrate transferrer; and a temperature adjuster configured to adjust a temperature of the cooling gas based on an output from the second temperature sensor, wherein the circuitry is configured to:

determine, based on an output from the first temperature sensor, whether a substrate on the substrate support is to be transferred with the first end-effector or with the second end-effector, control the robotic substrate transferrer to transfer the substrate on the substrate support from the substrate processing assembly using a selected one of the first end-effector and the second end-effector based on the determination, determine timing to clean an internal space of the substrate transfer chamber based on an output from the deposit detector, and output an instruction to start cleaning the internal space of the substrate transfer chamber at the determined timing.

2. The substrate transfer system according to claim 1, wherein the first substrate processed in the substrate processing assembly has a temperature between 0 to 300° C.

3. The substrate transfer system according to claim 1, wherein the first holding pad comprises a fluororesin.

4. The substrate transfer system according to claim 1, wherein the second substrate processed in the substrate processing assembly has a temperature lower than 0° C.

5. The substrate transfer system according to claim 1, wherein the second holding pad comprises a silicone resin.

6. The substrate transfer system according to claim 1, wherein the robotic substrate transferrer further includes:

a substrate holder, and a sensor receiver connected to a proximal end of the substrate holder, and the deposit detector is located on the sensor receiver.

7. The substrate transfer system according to claim 1, wherein the robotic substrate transferrer includes:

a plurality of transfer arms connected to one another, and a plurality of actuators, each of the plurality of actuators is located in an internal space of a corresponding transfer arm of the plurality of transfer arms to drive the corresponding transfer arm.

8. The substrate transfer system according to claim 7, wherein the cooling gas supply supplies the cooling gas into internal spaces of the plurality of transfer arms to cool the plurality of actuators.

9. The substrate transfer system according to claim 7, wherein the cooling gas supply supplies the cooling gas to distal end portions of the plurality of transfer arms.

10. The substrate transfer system according to claim 1, wherein the cooling gas is discharged through an outlet below the robotic substrate transferrer.

11. A substrate transfer system, comprising:

a substrate transfer chamber;

a robotic substrate transferrer in the substrate transfer chamber, the robotic substrate transferrer including:

a first end-effector including a holding pad configured to hold a substrate, a deposit detector located adjacent to the first end-effector, the deposit detector being configured to measure an amount of deposits disposed on the substrate, a second end-effector overlapping the first end-effector in a vertical direction, the end-effector including a plurality of pads to be disposed between the end-effector and another substrate, a base, a first transfer arm rotatably connected to the base, the first transfer arm including a first actuator, a second transfer arm rotatably connected to the first transfer arm, the second transfer arm including a second actuator, and a cooling flow path disposed inside the first transfer arm and the second transfer arm for cooling the first actuator and the second actuator; and circuitry being configured to determine timing to clean an internal space of the substrate transfer chamber based on an output from the deposit detector-, and to output an instruction to start cleaning the internal space of the substrate transfer chamber at the determined timing.

12. The substrate transfer system according to claim 11, wherein:

a distal end of the first end effector branches into two portions, and the first end-effector includes a plurality of pads to be disposed between the first end-effector and the substrate.

13. The substrate transfer system according to claim 11, wherein:

the deposit detector is configured to detect a resonance frequency of the substrate to determine the amount of deposits on the substrate.

14. A substrate transfer system, comprising:

a substrate transfer chamber;

a robotic substrate transferrer in the substrate transfer chamber, the robotic substrate transferrer including:

a base;

a plurality of transfer arms rotatably connected to one another, the plurality of transfer arms including a first transfer arm rotatably connected to the base and a second transfer arm rotatably connected to the first transfer arm; and a plurality of actuators, each of the plurality of actuators being located in an internal space of a corresponding transfer arm of the plurality of transfer arms to drive the corresponding transfer arm, the plurality of actuators including a first actuator located in the first transfer arm and a second actuator located in the second transfer arm; and a cooling flow path disposed inside the first transfer arm and the second transfer arm for cooling the first actuator and the second actuator; and a temperature control system, the temperature control system including:

a gas supply configured to supply air into the robotic substrate transferrer, a first temperature sensor configured to measure a temperature of an internal space of the robotic substrate transferrer, and a temperature adjuster configured to cool the air based on an output from the first temperature sensor.

15. The substrate transfer system according to claim 14, wherein:

the robotic substrate transferrer further includes a first end-effector, and a distal end of the first end-effector branches into two portions.

16. The substrate transfer system according to claim 14, wherein the temperature adjuster is a valve.

17. The substrate transfer system according to claim 14, further comprising an air tube routed through the internal spaces of the plurality of transfer arms, the air tube being connected to the temperature control system.

18. The substrate transfer system according to claim 14, wherein:

each actuator is configured to cause the corresponding transfer arm to rotate, the first temperature sensor being disposed at the first actuator among the plurality of actuators, and the temperature control system further includes a second temperature sensor disposed at the second actuator among the plurality of actuators.

* * * * *